US012442073B2

(12) United States Patent
Ackermann et al.

(10) Patent No.: US 12,442,073 B2
(45) Date of Patent: Oct. 14, 2025

(54) APPARATUS, SYSTEMS, AND METHODS OF USING AN ATMOSPHERIC EPITAXIAL DEPOSITION TRANSFER CHAMBER

(71) Applicant: Applied Materials, Inc., Santa Clara, CA (US)

(72) Inventors: Thomas Ackermann, Feichten (DE); Robert Huber, Feichten (DE)

(73) Assignee: Applied Materials, Inc., Santa Clara, CA (US)

( * ) Notice: Subject to any disclaimer, the term of this patent is extended or adjusted under 35 U.S.C. 154(b) by 567 days.

(21) Appl. No.: 18/049,906

(22) Filed: Oct. 26, 2022

(65) Prior Publication Data

US 2024/0141483 A1 May 2, 2024

(51) Int. Cl.

*C23C 16/44* (2006.01)
*C23C 16/52* (2006.01)
*C30B 25/14* (2006.01)

(52) U.S. Cl.

CPC .......... *C23C 16/4408* (2013.01); *C23C 16/52* (2013.01); *C30B 25/14* (2013.01)

(58) Field of Classification Search

CPC ..... C23C 16/4408; C23C 16/52; C30B 25/14; C30B 35/005
See application file for complete search history.

(56) References Cited

U.S. PATENT DOCUMENTS 5,657,786 A * 8/1997 DuRoss ................ F16K 11/207 137/15.01
7,993,458 B2 * 8/2011 Kondo .............. H01L 21/67196 156/345.31
2004/0166683 A1 8/2004 Pomarede et al.
2008/0274288 A1 11/2008 Kondo et al.
2010/0326637 A1 12/2010 Sasaki et al.
2011/0304078 A1 12/2011 Lee et al.

FOREIGN PATENT DOCUMENTS

KR 10-2016-0132138 A 11/2016
WO 2020-060751 A1 3/2020

OTHER PUBLICATIONS

International Search Report and Written Opinion dated Feb. 15, 2024 for Application No. PCT/US2023/035255.

* cited by examiner

*Primary Examiner* — Eric Keasel
(74) *Attorney, Agent, or Firm* — Patterson + Sheridan, LLP

(57) ABSTRACT

Implementations of the present disclosure relate to apparatus, systems, and methods of using a transfer chamber. In one or more implementations, gaseous impurities are reduced in a transfer chamber. In one implementation, a method includes receiving user input via a user interface indicating for the substrate processing system to conduct, according to a set of parameters, a service recovery operation that includes, for each cycle of a quantity of pump-purge cycles, operating a vacuum pump according to a base pressure to reduce a quantity of gas in the transfer chamber, then directing a purge gas to the transfer chamber according to a backfill pressure. The method also includes, after the cycles are complete, directing the purge gas into the transfer chamber until a threshold pressure is satisfied, and providing an indication via the user interface that the operation is complete.

20 Claims, 4 Drawing Sheets

APPARATUS, SYSTEMS, AND METHODS OF USING AN ATMOSPHERIC EPITAXIAL DEPOSITION TRANSFER CHAMBER

BACKGROUND

Field

Implementations of the present disclosure relate to apparatus, systems, and methods of using a transfer chamber. In one or more implementations, gaseous impurities (e.g., moisture and oxygen) are reduced in or removed from a transfer chamber, for example, in preparation for substrate processing following exposure of the transfer chamber to surrounding air (e.g., environmental air such as atmospheric air).

Description of the Related Art

Epitaxial deposition is a deposition process that may be used to grow layers on crystalline surfaces of substrates. A transfer chamber may be used to transfer a substrate between one or more other chambers for processing. The interior of the transfer chamber may become exposed to the surrounding air from time to time. For example, it may be desirable or necessary to open the transfer chamber to the surrounding air while accessing internal components of the transfer chamber during preventative or corrective maintenance. As another example, there may be leaks in the transfer chamber that allow in gaseous impurities, or contaminated substrates may be introduced into or present in the chamber. Additionally, an inadequate pump out time may be used for another chamber connecting to the transfer chamber, such as a load lock chamber, resulting in the introduction of gaseous impurities into the transfer chamber. Furthermore, the opening of doors of various chambers or components can flow gases into the transfer chamber. In selective epitaxial growth of epitaxial layers, including under atmospheric pressure, the presence of gaseous impurities, such as moisture or oxygen, can cause defects in substrates and the structures that are formed on or in the substrates.

Therefore, there is a need for improved methods, apparatus, and systems of using a transfer chamber (such as in relation to atmospheric epitaxial deposition) that facilitate reduced or removed gaseous impurities from the transfer chamber (e.g., in preparation for substrate processing following exposure of the transfer chamber to surrounding air).

SUMMARY

Implementations of the present disclosure relate to apparatus, systems, and methods of using a transfer chamber. In one or more implementations, gaseous impurities (e.g., moisture and oxygen) are reduced in or removed from a transfer chamber, for example, in preparation for substrate processing following exposure of the transfer chamber to surrounding air (e.g., environmental air such as atmospheric air).

In one implementation, a method of processing substrate processing includes receiving, via a user interface, user input indicating for the substrate processing system to conduct a service recovery operation for the transfer chamber according to a set of parameters that includes a base pressure and a backfill pressure. The method also includes operating, for each cycle of a quantity of pump-purge cycles, a vacuum pump according to the base pressure for the transfer chamber to reduce a quantity of gas in the transfer chamber. The method also includes directing, for each cycle of the quantity of pump-purge cycles and after operating the vacuum pump, a purge gas to the transfer chamber according to the backfill pressure. The method also includes directing, after the quantity of cycles is complete, the purge gas into the transfer chamber until a threshold pressure is satisfied. The method also includes displaying, via the user interface, an indication that the service recovery operation for the transfer chamber is complete.

In one implementation, a substrate processing system includes a transfer chamber, one or more load lock chambers, a vacuum pump fluidly connected to the one or more load lock chambers, a user interface, and a controller coupled with the user interface and the vacuum pump. The controller is configured to receive, via the user interface, user input indicating for the substrate processing system to conduct a service recovery operation for the transfer chamber according to a set of parameters that includes a base pressure and a backfill pressure. The controller is also configured to operate, for each cycle of a quantity of pump-purge cycles, the vacuum pump according to the base pressure for the transfer chamber to reduce a quantity of gas in the transfer chamber. The controller is also configured to direct, for each cycle of the quantity of pump-purge cycles and after operating the vacuum pump, a purge gas to the transfer chamber according to the backfill pressure. The controller is also configured to direct, after the quantity of cycles is complete, the purge gas into the transfer chamber until a threshold pressure is satisfied. The controller is also configured to display, via the user interface, an indication that the service recovery operation for the transfer chamber is complete.

In one implementation, a non-transitory computer readable medium for conducting a service recovery operation for a transfer chamber of a substrate processing system includes instructions that, when executed, cause a plurality of operations to be conducted. The plurality of operations include receiving, via a user interface, user input indicating for the substrate processing system to conduct a service recovery operation for the transfer chamber according to a set of parameters that includes a base pressure and a backfill pressure. The plurality of operations also include operating, for each cycle of a quantity of pump-purge cycles, a vacuum pump according to the base pressure for the transfer chamber to reduce a quantity of gas in the transfer chamber. The plurality of operations also include directing, for each cycle of the quantity of pump-purge cycles and after operating the vacuum pump, a purge gas to the transfer chamber according to the backfill pressure. The plurality of operations also include directing, after the quantity of cycles is complete, the purge gas into the transfer chamber until a threshold pressure is satisfied. The plurality of operations also include displaying, via the user interface, an indication that the service recovery operation for the transfer chamber is complete.

BRIEF DESCRIPTION OF THE DRAWINGS

So that the manner in which the above-recited features of the disclosure can be understood in detail, a more particular description of the disclosure, briefly summarized above, may be had by reference to implementations, some of which are illustrated in the appended drawings. It is to be noted, however, that the appended drawings illustrate only common implementations of this disclosure and are therefore not to be considered limiting of its scope, for the disclosure may admit to other equally effective implementations.

Figure 1:
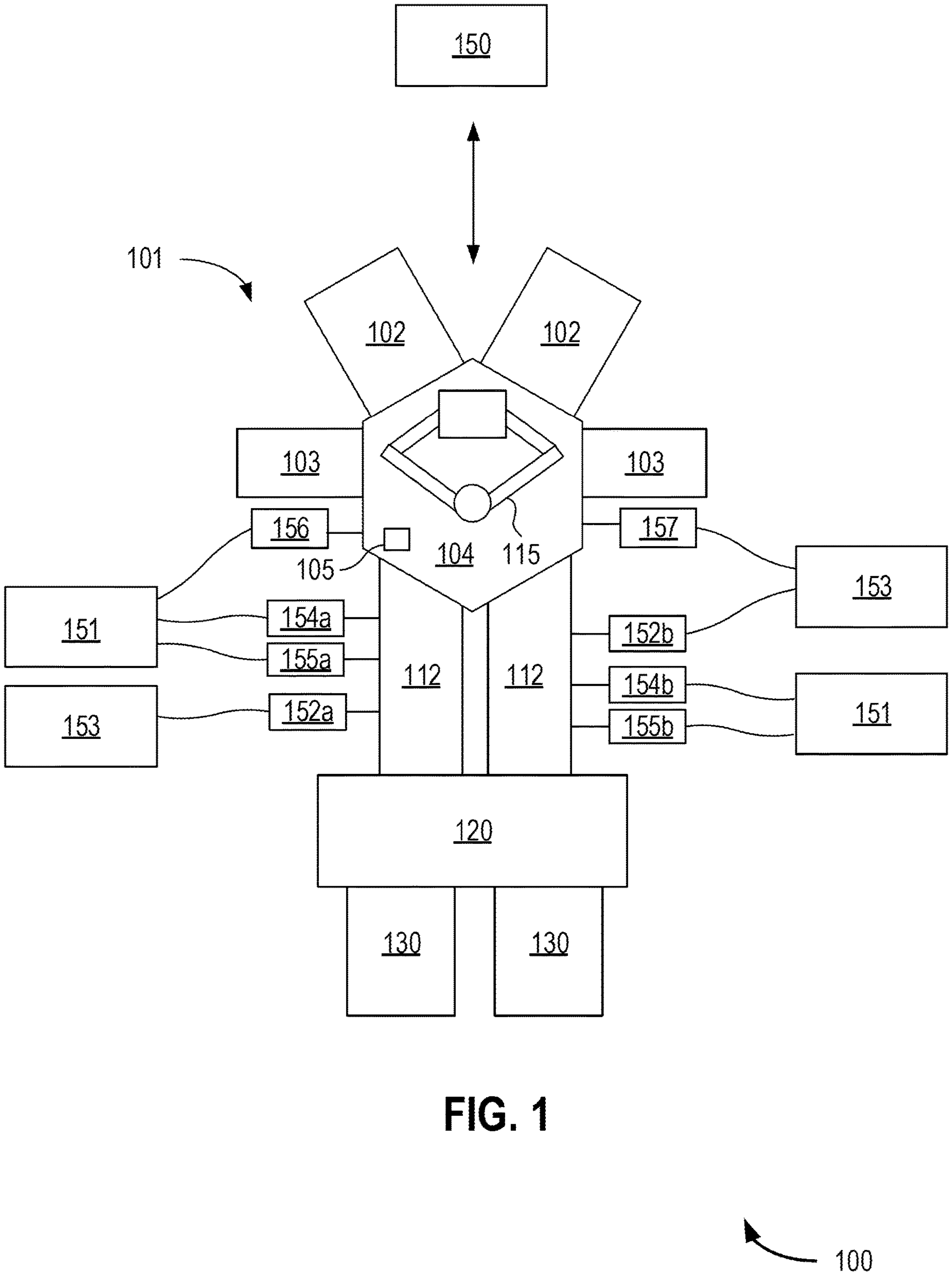
FIG. 1 is a schematic view of a system for processing substrates, according to one implementation.

To facilitate understanding, identical reference numerals have been used, where possible, to designate identical elements that are common to the figures. It is contemplated that elements disclosed in one implementation may be beneficially utilized on other implementations without specific recitation.

DETAILED DESCRIPTION

Implementations of the present disclosure relate to apparatus, systems, and methods of using a transfer chamber (such as in relation to an atmospheric epitaxial deposition chamber. In one or more implementations, gaseous impurities (e.g., moisture and oxygen) are reduced in or removed from a transfer chamber, for example, in preparation for substrate processing following exposure of the transfer chamber to surrounding air. In one or more embodiments, the transfer chamber is exposed, at least part of the time, to one or more atmospheric conditions.

To facilitate the production of superior epitaxial layers on substrates such as silicon substrates under atmospheric process chamber conditions, it is beneficial to reduce or eliminate the amount of gaseous impurities (e.g., oxygen or moisture) present during a deposition process. Therefore, it is advantageous to reduce or eliminate traces of oxygen or moisture from substrate processing systems (such as those that include epitaxial processing chambers). Possible ways of oxygen or moisture getting into the deposition chambers are for example leaks at the chambers themselves, contaminated substrates, too short pump out times (e.g., pump out times that are of an inadequate duration to lower the oxygen level, moisture, or both to a threshold level) of the loading locks into the transfer chamber (which may be referred to as the "inert" part of the machine), and oxygen presence inside the inert area of the machine. The opening of doors of the system may also result in oxygen or moisture flowing into the transfer chamber.

A transfer chamber used for atmospheric epitaxial deposition may be continuously or periodically purged with a purge gas (e.g., nitrogen, hydrogen, and/or argon) at a set or configured quantity (e.g., 45 liters per minute) to maintain the inert condition for the transfer chamber. The transfer chamber may not directly connect to a vacuum pump and may be configured as an atmospheric component of the atmospheric epitaxial (substrate) processing system. For example, the vacuum pump may be fluidly connected to a load lock chamber that is a part of the system.

For preventive and corrective maintenance activities the lid of the transfer chamber may be opened on a frequent basis to gain access to the components inside, for example a transfer robot or slit valves. When the lid of the transfer chamber is opened, the surrounding air can get into the transfer chamber.

When the maintenance activities are finished, the lid of the transfer chamber is closed again and a leak check can be conducted. However, certain operations (even using 45 liter per minute of a purge gas such as nitrogen) may be insufficient to establish an oxygen-free or substantially oxygen-free condition (e.g., an oxygen level below a threshold value) inside the transfer chamber after the lid was opened and closed again. In such case, oxygen contamination problems may be a consequence if substrate processing is started immediately or soon after a maintenance activity on the transfer chamber concludes. Such operations can result in processing delays and lower throughput. The effect can also include a high defect level of the substrates and contaminants (e.g., so-called "spider webs") inside epitaxial deposition chamber. "Spider webs" are tiny quartz $SiO_2$ strings that may form and hang down from the upper surface of a process chamber, such as a process chamber's upper window.

It is also possible that a transfer chamber may not be capable of evacuation, or methods of addressing the impurities can be complex, time-consuming, and/or having high rates of error or failure. As one example, a user may forget to close certain components (such as doors or valves) that affect the impurities in the transfer chamber. For example, surrounding air, dust, and/or moisture can move into the transfer chamber. As another example, a user may open and/or close components too early and/or too late, which can cause leaks and/or can affect impurities in the transfer chamber.

A service recovery operation (which may also be referred to as a service recovery macro) for the transfer chamber of a substrate processing system operating for atmospheric epitaxial deposition may more quickly, safely, and consistently recover the transfer chamber to a serviceable condition following exposure of the transfer chamber to the surrounding air. The service recovery operation may be conducted according to a set of parameters. The set of parameters includes a base pressure and a backfill pressure. The service recovery operation may be conducted according to a set of parameters.

To use the transfer chamber, user input may be received indicating for the substrate processing system to conduct the service recovery operation for the transfer chamber according to the set of parameters, including the base pressure and a backfill pressure. The service recovery operation includes operating, for each cycle of a quantity of pump-purge cycles, a vacuum pump according to the base pressure to reduce a quantity of gas in the transfer chamber. The service recovery operations further includes directing, for each cycle of the quantity of pump-purge cycles and after operating the vacuum pump, a purge gas to the transfer chamber according to the backfill pressure. The service recovery operation further includes directing, after the quantity of cycles is complete, the purge gas into the transfer chamber until a threshold pressure is satisfied. Following the service recovery operation, an indication that the service recovery operation for the transfer chamber is complete may be displayed via the user interface.

The set of parameters may include one or more of a switchover point pressure, a base time duration, a load lock chamber selection, or a quantity of pump-purge cycles within the service recovery operation. The switchover point pressure may be from operation of a vacuum pump according to a slow rough pump to fast rough pump for a load lock chamber. The base time duration may be the time for which the vacuum pump operates once the base pressure is reached. The load lock chamber selection may indicate which load lock chamber to use to pump the transfer chamber, when multiple load lock chambers are present. The quantity of pump-purge cycles may be the quantity of repetitions (cycles) of certain operations within the service recovery operation. For example, the service recovery operation may include an operation that applies a vacuum pump to the transfer chamber (directly or indirectly), then in a following operation directs a purge gas (e.g., $N_2$ or $H_2$) to the transfer chamber to increase the pressure in the transfer chamber. These two operations may be part of a single cycle, and the operations of the single cycle may be repeated (cycled) according to the quantity of pump-purge cycles.

In one or more implementations, a user may provide a single indication for the service recovery operation to be conducted, for example the user may provide one click for the service recovery operation to be initiated and executed. In one or more implementations, values for one or more of the set of parameters, such as preset or preconfigured values, may be presented to the user via a user interface. The user may proceed to indicate for the service recovery operation to proceed according to these values. The user may select an alternative value and update the value of the parameter accordingly, then indicate for the service recovery operation to proceed with the updated value. For example, the value associated with one of the parameters of the set of parameters may be updated, while the values for remaining parameters may remain at the pre-configured value.

FIG. 1 is a schematic view of a system 100 for processing substrates, according to one implementation. The system 100 includes a cluster tool 101. The cluster tool 101 of the system 100 includes one or more processing chambers, such as epitaxy chambers 102 and/or etch chambers 103 (a plurality of processing chambers are shown) coupled to at least one transfer chamber 104.

A transfer chamber 104 is coupled to one or more epitaxy chambers 102. The transfer chamber 104 has a centrally disposed transfer robot 115 for transferring substrates between the epitaxy chambers 102, the etch chambers 103, and a set of load lock chambers 112. A factory interface 120 is connected to the transfer chamber 104 by the load lock chambers 112. The factory interface 120 is coupled to one or more pods 130 on the opposite side of the load lock chambers 112. The pods 130 typically are front opening unified pods (FOUP) that are accessible from the clean room in which the cluster tool 101 is disposed.

During operation, substrates are transferred to one or more epitaxy chambers 102 to selectively grow an epitaxial layer on the substrates. The substrates are then transferred to one or more etch chambers 103, in which the substrates are exposed to atomic hydrogen radicals to etch the substrates and remove nodules from the substrates. The system 100 can include one or more anneal chambers, in which the epitaxial layers formed on the substrates are annealed to an anneal temperature.

As described below, the transfer chamber 104 can be continuously or periodically purged with a purge gas (e.g., nitrogen, hydrogen, and/or argon) during operations such that the transfer robot 115 can transfer substrates under nitrogen, hydrogen, and/or argon atmosphere between all the processing chambers, the load lock chambers 112, and the pass through stations 106. Transferring the substrates under a nitrogen, hydrogen, and/or argon atmosphere can facilitate decreasing the chance of contamination, improving the quality of the deposited epitaxial films. The present disclosure contemplates that one or more of the chambers shown in the system 100 may not be clustered into the cluster tool 101. For example, either or both of the etch chambers 103 in the system 100 can be separate (not clustered) from the cluster tool 101 having the epitaxy chambers 102.

In the implementation shown in FIG. 1, the epitaxy chambers 102 and the etch chambers 103 are distinct from each other. In one embodiment, which can be combined with other embodiments, each processing chamber of the processing chambers, such as epitaxy chambers 102 and etch chambers 103, is a single processing chamber. In such an embodiment, the epitaxy chambers 102 are two single processing chambers, and the etch chambers 103 are two single processing chambers.

The system 100 includes a controller 150 that is configured to control operations of the cluster tool 101. The controller 150 is coupled to the pods 130, the factory interface 120, the load lock chambers 112, the epitaxy chambers 102, the transfer chamber 104, the transfer robot 115, and the etch chambers 103 to control the operations thereof. The controller 150 can be similar to, for example, to the controller 301 described below. The controller 150 includes instructions that, when executed cause the cluster tool 101 to conduct one or more operations as described with reference to FIG. 2. In one embodiment, which can be combined with other embodiments, the controller 150 is a controller that includes the instructions to receive, via a user interface, user input indicating for the substrate processing system to conduct a service recovery operation for the transfer chamber according to a set of parameters. The set of parameters includes a base pressure and a backfill pressure. The controller further includes instructions to operate, for each cycle of a quantity of pump-purge cycles, a vacuum pump according to the base pressure for the transfer chamber to reduce a quantity of gas in the transfer chamber. The controller further includes instructions to direct, for each cycle of the quantity of pump-purge cycles and after operating the vacuum pump, a purge gas to the transfer chamber according to the backfill pressure. The controller further includes instructions to direct, after the quantity of cycles is complete, the purge gas into the transfer chamber until a threshold pressure is satisfied. The controller further includes instructions to display, via the user interface, an indication that the service recovery operation for the transfer chamber is complete. The system 100 includes one or more vacuum pumps 151 (such as one or more vacuum pumps) fluidly connected to each load lock chamber 112 through a respective slow rough valve 154*a*, 154*b* and a respective fast rough valve 155*a*, 155*b*. The system 100 includes one or more purge gas sources 153 fluidly connected to each load lock chamber 112 through a respective purge valve 152*a*, 152*b*

The system includes one or more transfer pump valves 156 (which may or may not be fluidly connected to the same one or more vacuum pumps 151) and one or more transfer purge valves 157 (which may or may not be fluidly connected to the same one or more purge gas sources 153). The present disclosure contemplates that the one or more transfer pump valves 156 and/or the one or more transfer purge valves 157 can be omitted. The vacuum pumps 151 shown in FIG. 1 can be integrated into a single vacuum pump and/or the purge gas sources 153 shown in FIG. 1 can be integrated into a single purge gas source.

Prior to the pump-purge cycles, the system 100 closes the transfer pump valves 156 (if used) and the transfer purge valves 157 (if used), and/or confirms that the transfer pump valves 156 (if used) and transfer purge valves 157 (if used) are already closed. During the pump-purge cycles, gas is exhausted form the transfer chamber 104 through one or more of the load lock chambers 112, and purge gas is supplied into the transfer chamber 104 through one or more of the load lock chambers 112.

Figure 2:
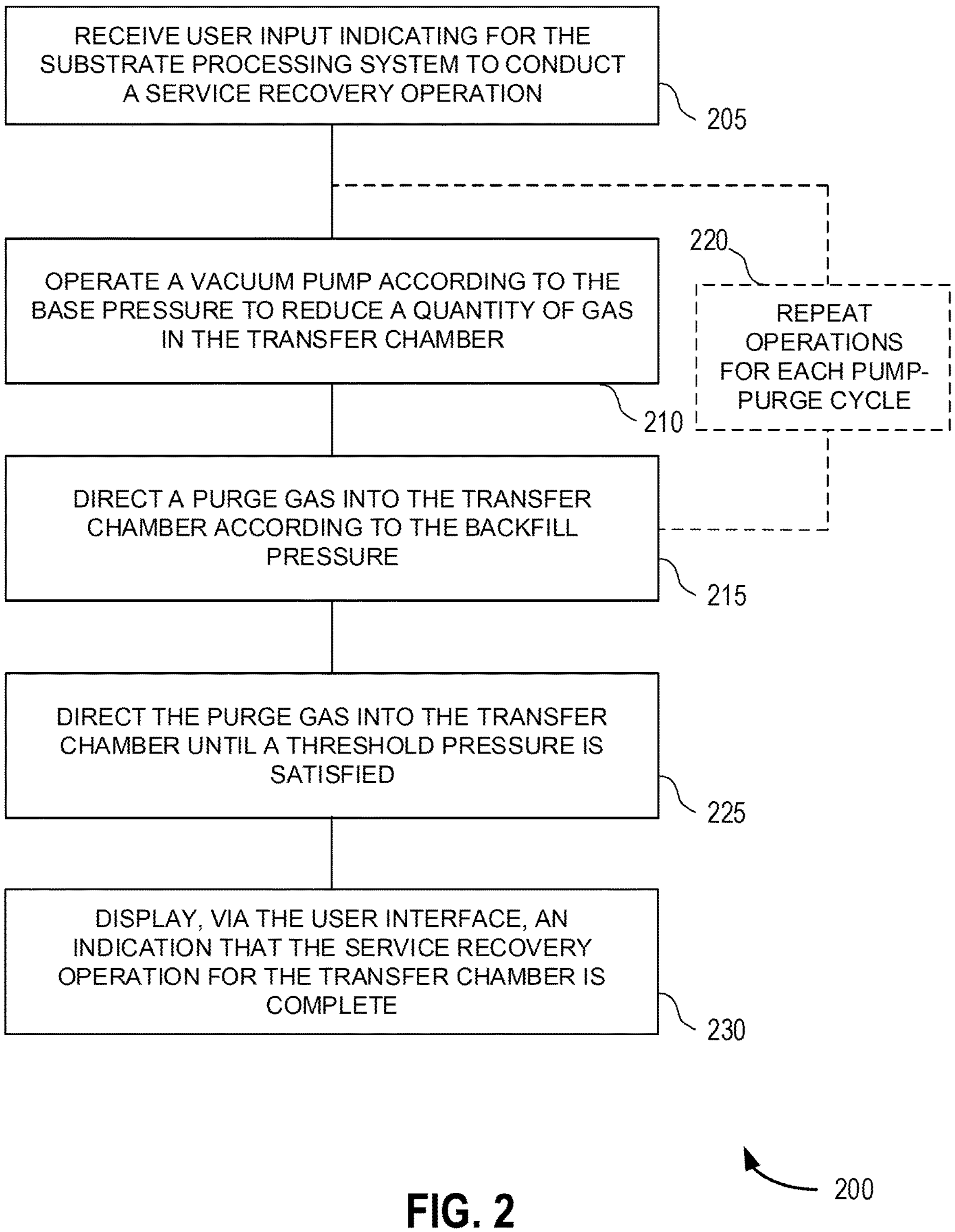
FIG. 2 is a schematic view of a method of using a transfer chamber of a substrate processing system, according to one implementation.

FIG. 2 is a schematic view of a method 200 of using a transfer chamber of a substrate processing system. In one or more implementations, the transfer chamber is the transfer chamber 104, and the substrate processing system may be or include the system 100 and/or the cluster tool 101.

Operation 205 of the method 200 includes receiving user input indicating for the substrate processing system to conduct a service recovery operation according to a set of parameters. The set of parameters may include a base pressure and a backfill pressure. In one or more embodiments, the backfill pressure is a value set in the range of about 500 Torr to about 770 Torr, such as within a range of about 500 Torr to about 750 Torr. In one or more embodiments, the backfill pressure is about 760 Torr. In one or more embodiments, the backfill pressure is equal to, or within a difference of 20 Torr or less relative to, an atmospheric pressure. The base pressure can be implemented in the transfer chamber using, for example, a vacuum pump (such as the In one or more implementations, the set of parameters may further include one or more of an indication of a quantity (number) of pump-purge cycles, a switchover point pressure for the vacuum pump, a base time duration, or a load lock chamber selection (e.g., a selection of the load lock chamber through which the pumping occurs).

Figure 3:
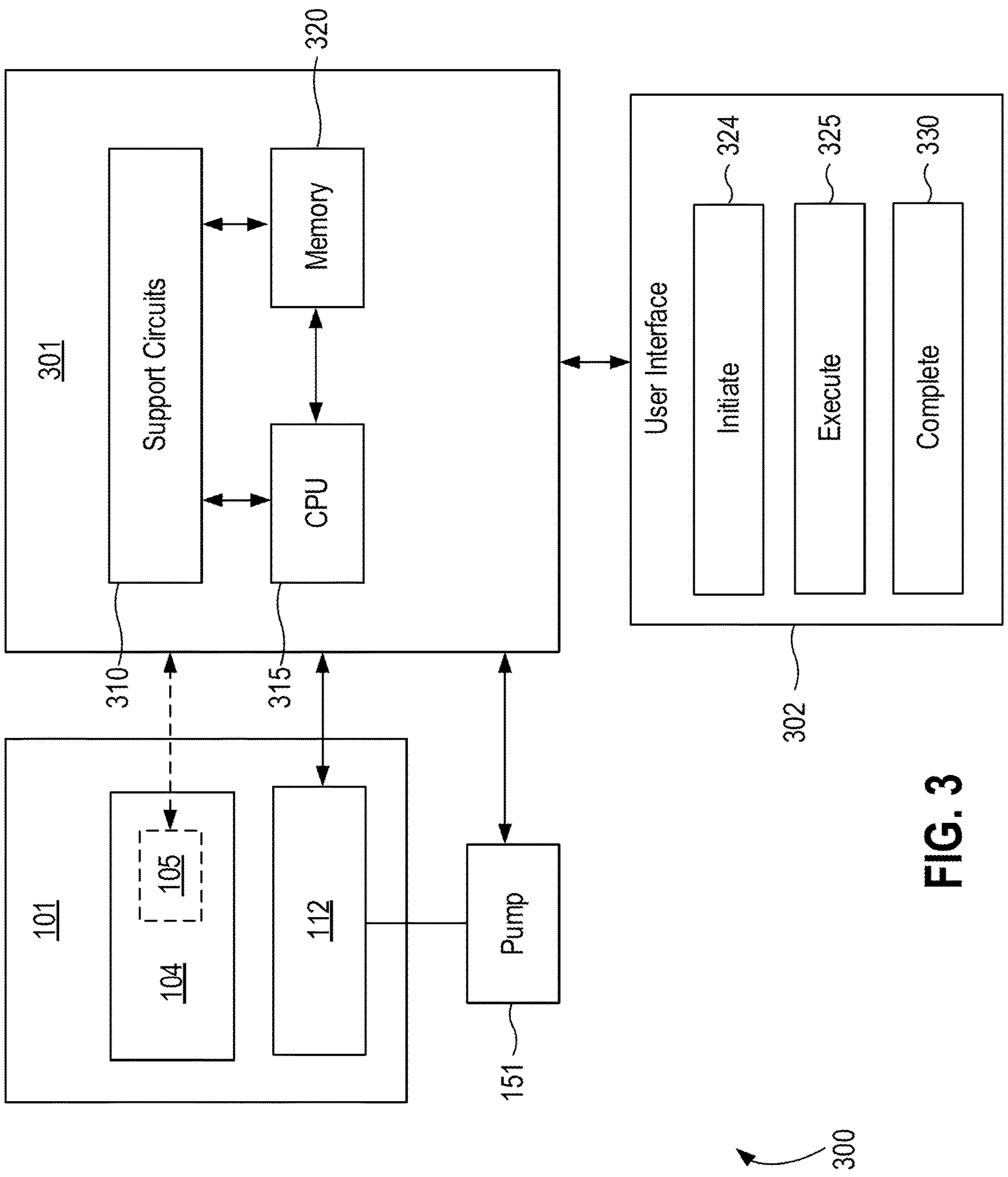
FIG. 3 is a schematic view of a substrate processing system, according to one implementation.
Figure 4:
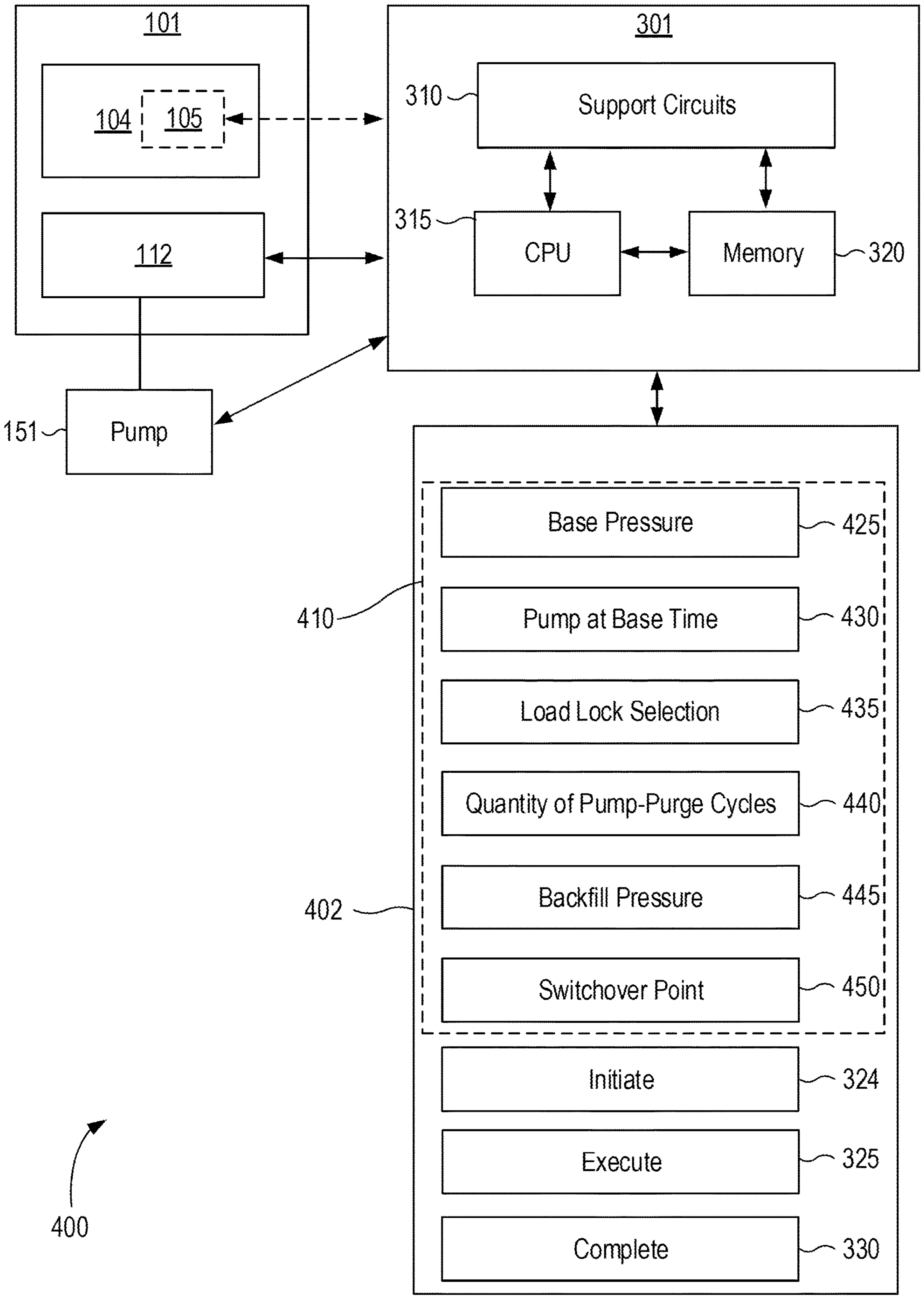
FIG. 4 is a schematic view of a substrate processing system, according to one implementation.

The user input may be received via a user interface, as further described herein, for example with reference to FIG. 3 or 4. In one or more implementations, a suggested value for one or more parameters of the set of parameters for the service recovery operation may be displayed via the user interface. The substrate processing system may then receive an indication of a user-selected value for each of the one or more parameters via the user interface.

In one or more implementations, the user input is an indication for the service recovery operation for the transfer chamber to proceed according to the set of parameters that are preconfigured (e.g., preset by the system or preselected by a user) for the service recovery operation. The user interface may display the preconfigured values for the set of parameters to the user, and the user may accept the preconfigured values by indicating for the service recovery operation to proceed. In one or more implementations, the user may be allowed to modify the preconfigured value for one or more (such as all) of the set of parameters. In one or more implementations, the user interface may display the values but disallow modification of one or more, or all, of the preconfigured values. In one or more implementations, the user interface may not display the preconfigured values, and the user may select to proceed, but not select or verify the preconfigured values. The preconfigured values may also be modified or updated by other mechanisms, for example by the manufacture of the substrate processing system via local or remote software or firmware update.

In one or more implementations, the service recovery operation may include a check to verify that a load lock chamber is in a proper state to offer or provide a pumping capability according to the service recovery operation. Where the substrate processing system includes two or more load lock chambers, the check may verify that one or more, or all, of the load lock chambers are in the proper state, including a load lock chamber offering the pumping capability. In one or more implementations, the set of parameters may further include a load lock chamber selection. In such an implementation, the method 200 may further include an operation of selecting, from a first slow rough valve and a second slow rough valve, the first slow rough valve to open in response to the load lock chamber selection, the first slow rough valve fluidly connecting the vacuum pump to a first load lock chamber that is fluidly connected to the transfer chamber, and the second slow rough valve fluidly connecting the vacuum pump to a second load lock chamber that is fluidly connected to the transfer chamber. The operation of selecting a slow rough valve to open may occur before operation 210. The operation of selecting a slow rough valve to open may also occur once, and be separate from the repeating operations for each pump-purge cycle according to operation 220. In one or more implementations the value for the load lock chamber selection may be obtained from a user via the user interface. In other implementation, the value for the load lock chamber selection may be preconfigured.

In one or more implementations, the service recovery operation may further include opening a slit valve of a load lock chamber, including the load lock chamber offering the pumping capability, and closing any open purge or exhaust values of the transfer chamber or verifying that all purge and exhaust values are closed. The method 200 may then further include opening the slow rough valve of the load lock chamber, the slow rough valve providing a fluid connection between the vacuum pump and the load lock chamber.

Operation 210 of the method 200 includes operating the vacuum pump according to the base pressure (which is specified as described for operation 205) to reduce a quantity of gas in the transfer chamber. The base pressure represents the target pressure down to which the transfer chamber is to be pumped during the service recovery operation. The base pressure may represent a maximum pressure below which the transfer chamber is to be maintained for a time period (e.g., the pump at the base time) as part of a pump-purge cycle. In one or more implementations the base pressure may be set to be a value between about 0.1 Torr to about 200 Torr, such between about 5 Torr to about 30 Torr.

In one or more implementations, the set of parameters may include a switchover point pressure. The method may optionally include directing the slow rough valve to open, then directing a fast rough valve to open in response to identifying that the switchover point pressure has been met after operating the vacuum pump to remove gas from the transfer chamber via the slow rough valve. A vacuum pump may operate to pump down the transfer chamber (directly or indirectly via one or more other chambers of the substrate processing system) in two or more stages, including via a slow rough valve and a fast rough valve. The switchover point may represent a pressure at which the vacuum pump switches from pumping down the transfer chamber via the slow rough valve to pumping down the transfer chamber via the fast rough valve or via both the slow rough valve and the fast rough valve. In one or more examples, the switchover point may be a value set in the range of about 150 Torr to 250 Torr, such as in the range of 180 Torr to 220 Torr. In one or more examples, the switchover point may be or be about 200 Torr. In one or more examples, the base pressure is less than the switchover point.

In one or more implementations, the set of parameters may include a base time duration. Operation 210 may include operating the vacuum pump for at least the base time duration (which may be referred to as "pump at base"), and according to the base pressure. The base time duration may correspond to a time for which the vacuum pump is operated during the service recovery operation after the base pressure is reached. The method may then include, after the base time duration, directing a purge valve to open to direct the purge gas into the transfer chamber. In one or more embodiments, the base time duration is at least 5 seconds. In one or more embodiments, the base time duration is higher than 5 seconds, for example on the order of minute(s), such as 1 minute or higher.

Operation 215 of the method 200 includes directing a purge gas into the transfer chamber according to the backfill pressure. In one or more implementations, after the pump at the base pressure for the base time is finished (the base time duration is complete), operation 215 includes opening the purge valve of the transfer chamber to backfill the transfer chamber and the load lock chamber with the purge gas until the backfill pressure (backfill pressure setpoint) of the set of parameters is reached. The purge gas may be for example nitrogen, hydrogen, and/or argon. In one or more embodiments the purge gas is at least 99.9% nitrogen by atomic percentage, at least 99.9% hydrogen by atomic percentage, or at least 99.9% argon by atomic percentage. In one or more embodiments, the purge gas is at least 99.9999% nitrogen, at least 99.9999% hydrogen by atomic percentage, or at least 99.9999% argon by atomic percentage.

Operation 220 optionally includes repeating operations for each cycle of a quantity of pump-purge cycles, each cycle including for example operation 210 and operation 215. The routine of pump-purge cycles (for example, including operation 210 and operation 215) may start over again for as many times as had been selected by the user via the user interface (which may also be referred to as a service screen) for the quantity of pump-purge cycles (for example displayed as a "number of cycles" on the user interface service screen). The quantity of pump-purge cycles may be one or more, and may also be referred to as a set of cycles. In implementations where the quantity of pump-purge cycles is one, the method 200 may proceed directly from operation 215 to operation 225. In one or more embodiments, operations 210, 215 are conducted and/or repeated until an impurity level for an impurity (such as oxygen) falls below 0.1 ppm in the transfer chamber. In one or more embodiments, the operations 210, 215 are conducted at least twice.

Operation 225 of the method 200 includes directing the purge gas into the transfer chamber until a threshold pressure is satisfied. Operation 225 may be conducted following operation 215. Optionally, operation 225 may be conducted following completion of the quantity of cycles according to operation 220. Once the last cycle is finished, the backfill of the transfer chamber continues until the current atmospheric pressure is exceeded by the threshold pressure, then the atmospheric exhaust valve of the transfer chamber is opened and the purge gas continues to be directed into the transfer chamber (the supply of purge gas remains on). In one or more implementations the threshold pressure is about 5 Torr to about 20 Torr, such as 10 Torr, or at least 5 Torr. As further described herein, the purge gas may be nitrogen, hydrogen, and/or argon.

With the source of the purge gas remaining on, the service recovery operation (service routine) is done, and the slit valve between the transfer chamber and load lock chamber is closed.

Operation 230 of the method 200 includes displaying an indication that the service recovery operation for the transfer chamber is complete. The indication that the service recovery operation is complete may be displayed via the user interface.

In one or more implementations, the method 200 may include receiving, from an oxygen sensor, a signal indicating an impurity level (e.g., an oxygen level) of the transfer chamber. In one or more implementations, the oxygen sensor may be attached to the transfer chamber (such as the oxygen sensor 105) to directly measure an oxygen level of an internal volume within the transfer chamber. In one or more implementations, the oxygen sensor may be attached to a different chamber of the substrate processing system, for example one of the epitaxy chambers 102, the etch chambers 103, and/or the load lock chambers 112. The quantity of pump-purge cycles may be based on the signal indicating the impurity level for the transfer chamber. For example, an impurity level threshold may be set, and when the oxygen level threshold has been satisfied, according to the signal from the oxygen sensor, the cycling of the pump-purge cycles may complete such that the quantity of pump-purge cycles corresponds to the number of pump-purge cycles conducted for the oxygen level to reach the oxygen level threshold.

In one embodiment, which can be combined with other embodiments, a non-transitory computer-readable medium includes instructions that, when executed, cause a system to conduct one or more of the operations of the method 200, for example 205, 210, 215, 220, 225, and/or 230. In one example, which can be combined with other examples, the non-transitory computer-readable medium is a part of a controller.

FIG. 3 is a schematic view of a substrate processing system 300 having a transfer chamber, according to one implementation. The substrate processing system 300 may include one or more components of system 100, including cluster tool 101 that includes a transfer chamber 104 with optional oxygen sensor 105, and at least one load lock chamber 112. The substrate processing system 300 may also include the one or more vacuum pumps 151 in fluid connection with the cluster tool 101. In one or more implementations the one or more vacuum pumps 151 are in fluid connection with at least one load lock chamber 112 of the cluster tool 101. Components of the substrate processing system 300 may be in communication with and controlled by a controller 301.

In one implementation, controller 301 includes a central processing unit (CPU) 315, memory 320, and support circuits 310, which may be coupled for communication. The memory 320 is a non-transitory computer readable medium, such as controller 150 (shown in FIG. 1), and can coupled for communication. The non-transitory computer readable medium may include instructions for conducting a method of using a transfer chamber of a substrate processing system as further described herein, for example with reference to method 200 of FIG. 2. The memory 320 may include the instructions, and the instructions may be executed by the CPU 315. The substrate processing system 300 also includes the controller 150 (shown in FIG. 2) coupled to the substrate processing system 300 to control operations of the substrate processing system 300.

The controller 301 may be communicatively coupled to a user interface 302. The user interface 302 may allow a user to provide an indication for a service recovery operation for the transfer chamber 104 to proceed according to a set of parameters for the service recovery operation. The present disclosure contemplates that the user interface 302 can be part of the controller 301. As described above and below, the set of parameters can be preconfigured and/or specified by the user.

In one or more implementations, the user interface 302 may provide an interface to obtain user input via an execute component 325 (button, interface, command) indicating that the service recovery operation for the transfer chamber is to proceed according to a set of parameters that are preconfigured for the service recovery operation. As further discussed herein, the set of parameters may include one or more of a base pressure, a backfill pressure, a quantity of pump-purge cycles, a switchover point pressure, a base time duration, and/or a load lock chamber selection.

The user interface may display the preconfigured values for the set of parameters to the user, and the user may accept the preconfigured values by indicating for the service recovery operation to proceed. In one or more implementations, the user may indicate for the service recovery operation to proceed by selecting the execute component 325, and the service recovery operation may then proceed as described herein, for example according to the method 200 described with reference to FIG. 2. Once the service recovery operation is complete, the complete component 330 may display an indication that the process is complete via user interface 302.

In one or more implementations, the user interface may display preconfigured values for the set of parameters to the user, and the preconfigured values for one or more of the set of parameters may be modifiable by a user. In one or more implementations, the user interface may display the values but disallow modification of one or more, or all, of the preconfigured values. In one or more implementations, the user interface may not display the preconfigured values, and the user may select to proceed, but not select or verify the preconfigured values. The preconfigured values may also be modified or updated by other mechanisms, for example by the manufacturer of the substrate processing system via local or remote software or firmware update.

FIG. 4 is a schematic view of a substrate processing system 400 having a transfer chamber, according to one implementation. The substrate processing system 400 may include one or more components of system 100, including cluster tool 101 that includes the transfer chamber 104 with optional oxygen sensor 105, and at least one load lock chamber 112, and substrate processing system 300, including the one or more vacuum pumps 151, a CPU 315, memory 320, support circuits 310, and a user interface 402.

In one or more implementations, the substrate processing system 400 may provide the user interface 402 to obtain user input, as well as display information to a user in connection with the service recovery operation for the transfer chamber. In one or more embodiments, the user interface 402 includes an initiate component 324 (button, interface, command), and an executed component 325 indicating that the service recovery operation for the transfer chamber is to proceed. In one or more embodiments, a window 410 is displayed in response to the user selecting the initiate component 324. Upon the user selecting one or more parameter components 425-450 in the window 410 and/or the user selecting the execute component 325, the system automatically conducts the method 200 according to the one or more parameters. In one or more implementations, each parameter component 425-450 includes a fillable box and/or a drop-down menu that the user can specify the parameter by filling in the respective fillable box or selecting an option of the respective drop-down menu.

Once the service recovery operation is complete, the complete component 330 may display an indication that the process is complete via user interface 402. As further discussed herein, the set of parameters may include one or more of a base pressure, a backfill pressure, a quantity of pump-purge cycles, a switchover point pressure, a base time duration, or a load lock chamber selection.

The initiate component 324 can be displayed before the displaying of the window 410 and the execute component 325. The execute component 325 can be displayed during displaying the window 410, after displaying the window 410, and/or can be displayed on the user interface as part of the window 410. The complete component 330 can be displayed on the user interface after the window 410 and/or the execute component 325 are displayed, and/or after the window 410 and/or the execute component 325 are closed off of the user interface.

In one or more implementations, the user interface 402 may display a preconfigured, default, or suggested value for the set of parameters to the user. In one or more implementations, the user interface 402 may include one or more of a base pressure component 425, pump at base time component 430, load lock selection component 435, quantity of pump-purge cycles component 440, backfill pressure component 445, or switchover point component 450, which may display a base pressure value, pump at base time, load lock selection, quantity of pump-purge cycles, backfill pressure, or switchover point, respectively. In one or more implementations, the values for one or more of the set of parameters may be displayed to a user, but not modifiable by the user via the user interface.

In other implementations, the value for one or more of the set of parameters may be modifiable by a user. A default or suggested value may be displayed to a user, and the user interface may allow the user to modify the value. In one or more implementations, the preconfigured values can be modifiable by the user, for example, by filling the fillable boxes or selecting options from the drop-down menus. For example, the base pressure may be displayed as 1 Torr, modifiable by the user via the base pressure component 425 of the user interface to another value. As another example, the switchover point may be displayed as about 200 Torr, modifiable by the user via the switchover point component 450 of the user interface to another value.

In one or more implementations, each value may be constrained within a range of values selected by the user. For example, the base pressure may be displayed as about 1 Torr, modifiable by the user via the base pressure component 425 of the user interface to a value in the range of 0.1 Torr to about 200 Torr. As another example, the switchover point may be displayed as 200 Torr, modifiable by the user via the switchover point component 450 of the user interface to another value, modifiable by the user via the switchover point component 450 of the user interface to a value in the range of 150 Torr to 250 Torr.

In one or more implementations, machine learning or artificial intelligence may be used to determine a value for one or more parameters of the set of parameters. For example, controller 301 may further include a machine learning model that is being or is to be trained according to a set of training data. The input training data may include signaling from oxygen sensor 105 corresponding to an oxygen level or content of the transfer chamber, signaling from one or more pressure sensors of cluster tool 101 (e.g., a pressure sensor of the transfer chamber 104), and values for one or more parameters of the set of parameters. For example, one or more machine learning algorithms and/or one or more artificial intelligence algorithms can be used to optimize the selected parameters and/or the preconfigured parameters. The one or more machine learning algorithms and/or one or more artificial intelligence algorithms can use a linear regression model and/or an averaging scheme. The method 200 can be partially automatically conducted (e.g., with user input) and/or can be completely automatically conducted (e.g., without user input).

In one or more implementations, a user may conduct cycles of the service recovery operation as part of the process of preparing the substrate processing system for use, including the transfer chamber. The oxygen level, pressure, and associated times, as well as one or more parameter values may be inputs to the machine learning model as the cycles of the service recovery operation is conducted. The machine learning model may output a value for one or more of the parameters of the set of parameters, which may then be used in subsequent service recovery operations. For example, the machine learning model may output a value for a pump at base time parameter, and the pump at base time component 430 of controller 301 may subsequently use the value during the service recovery operation.

Benefits of the present disclosure include removing or eliminating traces of oxygen or moisture from a substrate processing system, including the transfer chamber of the system, at a reduced timeline. Benefits also include reduced machine downtime, reduced processing times, increased throughput, reduced substrate defects, and reduced or eliminated errors and/or failures in impurity reduction.

It is contemplated that various subject matter disclosed herein may be combined. As an example, one or more aspects, features, components, operations, and/or properties of the system 100, the method 200, the substrate processing system 300, and/or the substrate processing system 400 may be combined. Moreover, it is contemplated that the various subject matter disclosed herein may include some or all of the aforementioned benefits.

While the foregoing is directed to embodiments of the present disclosure, other and further embodiments of the disclosure may be devised without departing from the basic scope thereof. The present disclosure also contemplates that one or more aspects of the embodiments described herein may be substituted in for one or more of the other aspects described. The scope of the disclosure is determined by the claims that follow.

What is claimed is:

1. A method of using a transfer chamber of a substrate processing system, comprising:

receiving via a user interface, user input indicating for the substrate processing system to conduct a service recovery operation for the transfer chamber according to a set of parameters that includes a base pressure and a backfill pressure;

operating, for each cycle of a quantity of pump-purge cycles, a vacuum pump according to the base pressure for the transfer chamber to reduce a quantity of gas in the transfer chamber;

directing, for each cycle of the quantity of pump-purge cycles and after operating the vacuum pump, a purge gas to the transfer chamber according to the backfill pressure;

directing, after the quantity of cycles is complete, the purge gas into the transfer chamber until a threshold pressure is satisfied; and displaying, via the user interface, an indication that the service recovery operation for the transfer chamber is complete.

2. The method of claim 1, further comprising:

displaying, via the user interface, a suggested value for one or more parameters of the set of parameters for the service recovery operation; and receiving, via the user interface, an indication of a user-selected value for the one or more parameters.

3. The method of claim 1, wherein the user input comprises an indication for the service recovery operation for the transfer chamber to proceed according to the set of parameters that are preconfigured for the service recovery operation.

4. The method of claim 1, wherein the set of parameters further include a switchover point pressure, and the service recovery operation further comprises:

directing a slow rough valve to open; and directing a fast rough valve to open in response to identifying that the switchover point pressure has been met after operating the vacuum pump to remove gas from the transfer chamber via the slow rough valve.

5. The method of claim 1, wherein the set of parameters further includes a base time duration, and the service recovery operation further comprises:

operating the vacuum pump for at least the base time duration based at least in part on operating the vacuum pump according to the base pressure; and directing a purge valve to open to direct the purge gas to the transfer chamber after the base time duration.

6. The method of claim 1, wherein the set of parameters further includes a load lock chamber selection, and the service recovery operation further comprises:

selecting, from a first slow rough valve and a second slow rough valve, the first slow rough valve to open in response to the load lock chamber selection, the first slow rough valve fluidly connecting the vacuum pump to a first load lock chamber that is coupled to the transfer chamber, and the second slow rough valve fluidly connecting the vacuum pump to a second load lock chamber that is coupled to the transfer chamber.

7. The method of claim 1, further comprising:

receiving, from an oxygen sensor, a signal indicating an oxygen level of the transfer chamber, wherein the quantity of pump-purge cycles is based at least in part on the signal indicating the oxygen level for the transfer chamber.

8. The method of claim 1, wherein the purge gas comprises at least 99.9999% nitrogen by atomic percentage and the threshold pressure is at least 5 Torr greater than an atmospheric pressure.

9. A substrate processing system, comprising:

a transfer chamber;

one or more load lock chambers;

a vacuum pump fluidly connected to the one or more load lock chambers;

a user interface; and a controller coupled to the user interface and the vacuum pump, the controller configured to:

receive, via the user interface, user input indicating for the substrate processing system to conduct a service recovery operation for the transfer chamber according to a set of parameters that includes a base pressure and a backfill pressure, operate, for each cycle of a quantity of pump-purge cycles, the vacuum pump according to the base pressure for the transfer chamber to reduce a quantity of gas in the transfer chamber, direct, for each cycle of the quantity of pump-purge cycles and after operating the vacuum pump, a purge gas to the transfer chamber according to the backfill pressure, direct, after the quantity of cycles is complete, the purge gas into the transfer chamber until a threshold pressure is satisfied, and display, via the user interface, an indication that the service recovery operation for the transfer chamber is complete.

10. The substrate processing system of claim 9, wherein the controller is further configured to:

display, via the user interface, a suggested value for one or more parameters of the set of parameters for the service recovery operation; and receive, via the user interface, an indication of a user-selected value for the one or more parameters.

11. The substrate processing system of claim 9, wherein the user input comprises an indication for the service recovery operation for the transfer chamber to proceed according to the set of parameters that are preconfigured for the service recovery operation.

12. The substrate processing system of claim 9, wherein:
the set of parameters further include a switchover point pressure;
the substrate processing system further comprises:
a slow rough valve between the vacuum pump and the one or more load lock chambers; and
a fast rough valve between the vacuum pump and the one or more load lock chambers; and
the controller is further configured to:
direct the slow rough valve to open; and
direct the fast rough valve to open in response to identifying that the switchover point pressure has been met after operating the vacuum pump to remove gas from the transfer chamber via the slow rough valve.

13. The substrate processing system of claim 9, wherein:
the set of parameters further includes a base time duration;
the substrate processing system further comprises a purge valve that fluidly connects the one or more load lock chambers to a source of the purge gas; and
the controller is further configured to:
operate the vacuum pump for at least the base time duration based at least in part on operating the vacuum pump according to the base pressure; and
direct the purge valve to open to direct the purge gas from the source of the purge gas to the transfer chamber through the one or more load lock chambers after the base time duration.

14. The substrate processing system of claim 9, wherein:
the set of parameters further includes a load lock chamber selection;
the one or more load lock chambers comprise:
a first load lock chamber coupled to the transfer chamber;
a first slow rough valve fluidly connecting the vacuum pump to the first load lock chamber;
a second load lock chamber coupled to the transfer chamber;
a second slow rough valve fluidly connecting the vacuum pump to the first load lock chamber; and
the controller is further configured to select, from the first slow rough valve and the second slow rough valve, the first slow rough valve to open in response to the load lock chamber selection.

15. The substrate processing system of claim 9, wherein:
the substrate processing system further comprises an oxygen sensor coupled to the transfer chamber; and
the controller is further configured to:
receive, from the oxygen sensor, a signal indicating an oxygen level of the transfer chamber; and
determine the quantity of pump-purge cycles based at least in part on the oxygen level.

16. A non-transitory computer readable medium for conducting a service recovery operation for a transfer chamber of a substrate processing system, the non-transitory computer readable medium comprising instructions that, when executed, cause a plurality of operations to be conducted, the plurality of operations comprising:
receiving, via a user interface, user input indicating for the substrate processing system to conduct the service recovery operation for the transfer chamber according to a set of parameters that includes a base pressure and a backfill pressure;
operating, for each cycle of a quantity of pump-purge cycles, a vacuum pump according to the base pressure for the transfer chamber to reduce a quantity of gas in the transfer chamber;
directing, for each cycle of the quantity of pump-purge cycles and after operating the vacuum pump, a purge gas to the transfer chamber according to the backfill pressure;
directing, after the quantity of cycles is complete, the purge gas into the transfer chamber until a threshold pressure is satisfied; and
displaying, via the user interface, an indication that the service recovery operation for the transfer chamber is complete.

17. The non-transitory computer readable medium of claim 16, wherein the plurality of operations further comprise:
displaying, via the user interface, a suggested value for one or more parameters of the set of parameters for the service recovery operation; and
receiving, via the user interface, an indication of a user-selected value for the one or more parameters.

18. The non-transitory computer readable medium of claim 16, wherein the user input comprises an indication for the service recovery operation for the transfer chamber to proceed according to the set of parameters that are preconfigured for the service recovery operation.

19. The non-transitory computer readable medium of claim 16, wherein the set of parameters further include a switchover point pressure, and the plurality of operations further comprise:
directing a slow rough valve to open; and
directing a fast rough valve to open in response to identifying that the switchover point pressure has been met after operating the vacuum pump to remove gas from the transfer chamber via the slow rough valve.

20. The non-transitory computer readable medium of claim 19, wherein the set of parameters further includes a base time duration, and the plurality of operations further comprise:
operating the vacuum pump for at least the base time duration based at least in part on operating the vacuum pump according to the base pressure; and
directing a purge valve to open to direct the purge gas to the transfer chamber through a load lock chamber after the base time duration,
wherein the switchover point pressure is 200 Torr, the base pressure is less than 200 Torr, the base time duration is at least 5 seconds, and the backfill pressure is within a range of 500 Torr to 770 Torr.

* * * * *